(12) United States Patent
Hanson et al.

(10) Patent No.: US 6,471,879 B2
(45) Date of Patent: *Oct. 29, 2002

(54) BUFFER LAYER IN FLAT PANEL DISPLAY (75) Inventors: Robert J. Hanson; Won-Joo Kim, both of Boise; Mike E. Pugh, Nampa, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/960,818

(22) Filed: Sep. 21, 2001

(65) Prior Publication Data

US 2002/0011459 A1 Jan. 31, 2002

Related U.S. Application Data (63) Continuation of application No. 09/387,910, filed on Sep. 1, 1999, now Pat. No. 6,322,712.

(51) Int. Cl.⁷ .............................................. B29D 11/00
(52) U.S. Cl. .................. 216/24; 205/118; 205/122; 205/183; 205/190; 438/608; 427/58; 427/162
(58) Field of Search ............................... 216/24; 205/118, 205/122, 183, 190; 438/608; 427/162, 58

(56) References Cited

U.S. PATENT DOCUMENTS

| | | | |
|---|---|---|---|
| 3,941,630 A | * 3/1976 | Larrabee ...................... | 156/13 |
| 4,012,756 A | 3/1977 | Chaudhari et al. | |
| 4,012,767 A | 3/1977 | Brown et al. | |
| 4,307,132 A | 12/1981 | Chu et al. | |
| 4,790,920 A | 12/1988 | Krzanich | |
| 4,894,116 A | 1/1990 | Barrow et al. | |
| 4,921,584 A | 5/1990 | Koski et al. | |
| 5,194,136 A | * 3/1993 | Jeung et al. ................. | 205/122 |
| 5,259,870 A | 11/1993 | Edlund | |
| 5,959,763 A | * 9/1999 | Bozler et al. ............... | 359/290 |
| 6,172,733 B1 | 1/2001 | Hong et al. | |

FOREIGN PATENT DOCUMENTS

| | | | |
|---|---|---|---|
| DE | 2131143 | 2/1972 | |
| EP | 0 395 544 B1 | 3/1996 | |
| JP | 49034906 | 3/1974 | |
| JP | 52 027354 | 3/1977 | |
| JP | 80007697 | 2/1980 | |
| JP | 1083655 | 3/1989 | |
| JP | 4933341 | 1/1991 | |
| JP | 4232250 | 8/1992 | |
| JP | 5-127183 | * 5/1993 | ......... G02F/1/1343 |

OTHER PUBLICATIONS

Liang, C.W., et al., "Characterization of anodic aluminum oxide film and its application to amorphous silicon thin film transistors", Materials Chemistry and Physics 43 (1996) pp. 166–172.

Seo, H.S., et al., "Hillock–Free Al–Gate Materials Using Stress–Absorbing Buffer Layer for Large–Area AMLCDs", SID 96 Digest, pp. 341–344, 1992.

(List continued on next page.)

*Primary Examiner*—Randy Gulakowski
*Assistant Examiner*—M. Kornakov
(74) *Attorney, Agent, or Firm*—Knobbe, Martens, Olson & Bear LLP (57) ABSTRACT

In devices such as flat panel displays, an aluminum oxide layer is provided between an aluminum layer and an ITO layer when such materials would otherwise be in contact to protect the ITO from optical and electrical defects sustained, for instance, during anodic bonding and other fabrication steps. This aluminum oxide barrier layer is preferably formed either by: (1) partially or completely anodizing an aluminum layer formed over the ITO layer, or (2) an in situ process forming aluminum oxide either over the ITO layer or over an aluminum layer formed on the ITO layer. After either of these processes, an aluminum layer is then formed over the aluminum oxide layer.

12 Claims, 8 Drawing Sheets

OTHER PUBLICATIONS

T. Arai, et al., "Aluminum–based gate structure for active-matrix liquid crystal displays", IBM J. Res. vol. No. 3/4 May/Jul. 1998.

Muni, J.D., et al., "Electrostatic bonding of Si and glass using Al interlayer for macropacking of an FED", Institute of Advanced Engineering.

Quenzer, H.J., et al., Silicon—Silicon anodic–bonding with intermediate glass layers using spin–on glasses:, IEEE Feb. 11–15, 1996, $9^{th}$ International Workshop on MEMS.

Ching–Fa Yeh, et al., "The Characterization of $Al_2O_3$ Prepared by Anodic Oxidation", Jpn. J. Appl. Phys. vol. 32 (1993) pp. 2803–2808.

C.C. Wu et al., "Surface modification and indium tin oxide by plasma treatment: An effective method to improve the efficiency, brightness, and reliability of organic light emitting devices", Appl. Phys. Lett. 70 (11) Mar. 17, 1997, pp. 1348–1350.

J.E.A.M. van den Meerakker and W.R. ter Veen, "Reductive Corrosion of ITO in Contact with Al in Alkaline Solutions," Philips Research Laboratories, 5600 JA Eindhoven, The Netherlands, J. Electrochem Soc., vol. 139, No. 2, Feb. 1992, pp. 385–390.

* cited by examiner

BUFFER LAYER IN FLAT PANEL DISPLAY

CROSS-REFERENCE TO RELATED APPLICATION

This application is a continuation of U.S. patent application Ser. No. 09/387,910, filed Sep. 1, 1999 now U.S. Pat. No. 6,322,712.

REFERENCE TO GOVERNMENT CONTRACT

This invention was made with United States Government support under Contract No. DABT63-97-C-0001, awarded by the Advanced Research Projects Agency (ARPA). The United States Government has certain rights in this invention.

BACKGROUND OF THE INVENTION

1. Field of the Invention

This invention relates to preserving the electrical and optical properties of optically transparent and conductive films such as indium tin oxide (ITO), and more particularly, to providing a buffer or protective layer between aluminum and ITO for use in the fabrication of flat panel displays and the like.

2. Description of the Related Art

Optically transparent and electrically conductive materials such as indium tin oxide (ITO) find utility in flat panel display (FPD) industries such as field emission displays (FEDs), liquid crystal displays (LCDs), and organic light emitting devices (OLEDs), as well as in solar cells. Surface and bulk characteristics are imperative to the quality of electrical and optical properties of these and other optically transparent and electrically conductive films. It is therefore very important to ensure that such films exhibit the desired surface and bulk properties such that the desired degree of transmission of visible light and electrical properties are obtained.

Devices incorporating ITO often use an aluminum layer deposited over the ITO. For instance, in an FED device where the faceplate is connected to the baseplate using spacers, aluminum is often deposited over the ITO layer in the faceplate to establish sites for the bonding of misaligned spacers. More particularly, an aluminum layer is formed over the ITO layer, the aluminum layer having wells extending therein to the surface of the ITO layer. Bond pads are provided within these wells against the ITO layer at the desired spacer locations. Then, when an array of spacers is brought against the faceplate for anodic bonding, desired spacers contained in the array will bond to the bond pads, while other, misaligned spacers will bond to the aluminum layer. After bonding is complete, the aluminum layer with the misaligned spacers bonded thereto can be removed to leave the desired spacer configuration in the FED.

A problem with using aluminum with ITO in the above and other applications is that ITO is susceptible to corrosion in the presence of aluminum. Atomic and/or ionic diffusion occurs through the aluminum to the ITO during processes such as anodic bonding, thermal cycling, thermal diffusion processes, low energy ion implantation processes, and processes which include electric and/or magnetic fields. ITO is especially susceptible to corrosion in the presence of aluminum when exposed to alkaline or basic solutions or solvents. See J. E. A. M. van den Meerakker and W. R. ter Veen, *J. Electrochem. Soc.*, vol. 139, no. 2, 385 (1992). Corrosion of ITO in alkaline solutions produces $SnO_3^{2-}$, which dissolves in the solution, and In metal, which forms grains at the surface. This causes a gray opaque appearance and a disconnection between the ITO and aluminum. Corrosion of the ITO can prove fatal in devices such as flat panel displays by reducing or eliminating the electrical conductivity and optical transparency of the ITO material. This corrosion can also cause delamination of the aluminum layer from the ITO. Redeposition of corrosion byproducts onto the substrate leads to additional defects, e.g., particle defects.

Furthermore, during anodic bonding of spacers to bond pads, excess oxide can change local optical properties of the adjacent ITO between the bond pads. Optical properties may also be changed due to etching.

Accordingly, what is needed is an improved method and apparatus for protecting the electrical and optical properties of an ITO layer and the like when such a layer is exposed to aluminum.

SUMMARY OF THE INVENTION

Briefly stated, the needs addressed above are solved by providing an aluminum oxide layer between an aluminum layer and an ITO layer to protect the ITO from optical and electrical defects sustained, for instance, during anodic bonding and other fabrication steps. This aluminum oxide barrier layer is preferably formed either by: (1) partially or completely anodizing an aluminum layer formed over the ITO layer, or (2) an in situ process forming aluminum oxide either over the ITO layer or over an aluminum layer formed on the ITO layer. After either of these processes, an aluminum layer is then formed over the aluminum oxide layer.

In accordance with one aspect of the present invention, a method of manufacturing a tin oxide/aluminum structure is provided. The method comprises forming a tin oxide layer, forming an aluminum oxide layer over the tin oxide layer, and forming a top aluminum layer over the aluminum oxide layer. In one embodiment, the aluminum oxide layer is formed by anodizing aluminum. In another embodiment, the aluminum oxide layer is formed by reactive sputtering.

In accordance with another aspect of the present invention, a tin oxide/aluminum structure is provided comprising a tin oxide layer over a substrate, an aluminum oxide layer over the tin oxide layer, and an aluminum layer over the aluminum oxide layer. In one embodiment, the tin oxide layer comprises indium tin oxide. A second aluminum layer may be provided between the tin oxide layer and the aluminum layer.

In accordance with another aspect of the present invention, a method of protecting an indium tin oxide layer in the presence of aluminum is provided. An aluminum oxide layer is formed between the indium tin oxide layer and the aluminum. The aluminum oxide layer is preferably formed either by anodizing the aluminum or by reactive sputtering.

In accordance with another aspect of the present invention, a method of fabricating a display device structure is provided. The method comprises forming an indium tin oxide layer, forming an aluminum oxide layer over the tin oxide layer, and forming an aluminum layer over the aluminum oxide layer. The structure is then exposed to an indium tin oxide-corrosive medium, such as would be used during the fabrication of the display device. The aluminum oxide prevents diffusion of the corrosive medium through the aluminum layer to the indium tin oxide layer. Once the structure is no longer exposed to the indium tin oxide-corrosive medium, the aluminum oxide and aluminum layers are removed. In one embodiment, these layers are removed after spacers have been fabricated. More preferably, by using an aluminum oxide barrier layer between the indium tin oxide layer and the aluminum layer, the aluminum oxide and aluminum layers can be removed using an etchant comprising phosphoric acid at a temperature up to about 60° C., without damaging the indium tin oxide.

In accordance with another aspect of the present invention, a display device structure comprises a substrate, an electrically conductive and optically transparent layer over the substrate, an aluminum oxide layer over the electrically conductive and optically transparent layer, and an aluminum layer over the aluminum oxide layer. In one embodiment, the aluminum oxide layer has a thickness of between about 500 and 1,500 Å, and the aluminum layer has a thickness of between about 4,500 and 6,000 Å. The aluminum oxide layer preferably comprises $AlO_x$ where x is between about 0.25 and 1.5.

DETAILED DESCRIPTION OF THE PREFERRED EMBODIMENTS

The preferred embodiments describe flat panel display devices, and more particularly, fabrication of the faceplate of an FED device using indium tin oxide and the like. It will be appreciated that although the preferred embodiments are described with respect to FED devices, the methods and apparatus taught herein are applicable to other flat panel display devices such as liquid crystal displays (LCDs), organic light emitting devices (OLEDs), plasma displays, vacuum fluorescent displays (VFDs), electroluminescent displays (ELDs), as well as solar cells. Other devices incorporating ITO and similar materials, such as other tin oxides, are also contemplated as being within the scope of this invention, as well as any device which employs an aluminum layer formed over an ITO or similar layer.

Figure 1:
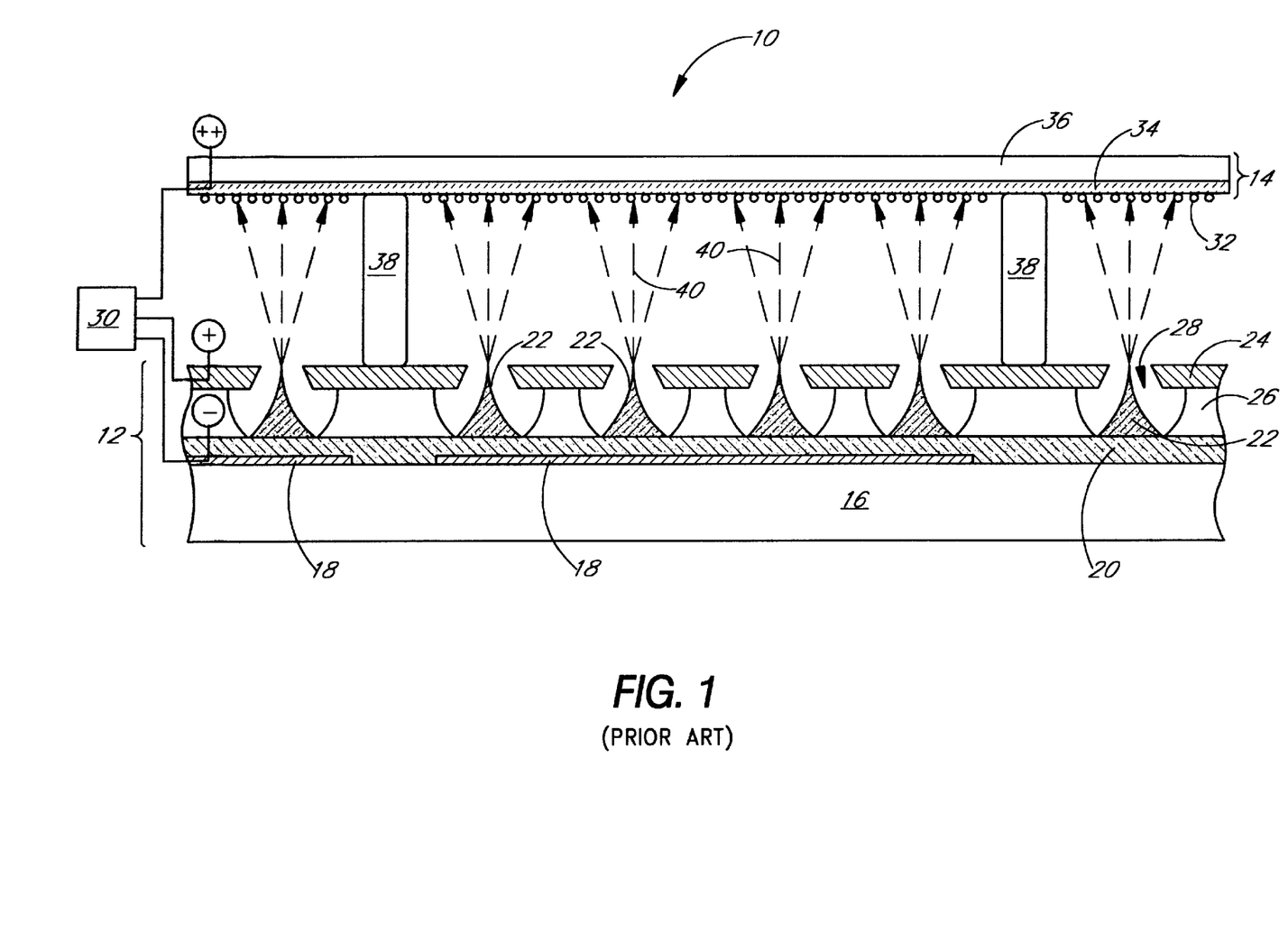
FIG. 1 is a schematic cross-sectional view of a flat panel display including a plurality of field emission devices.

FIG. 1 illustrates a portion of a flat panel display, including a plurality of field emission devices. Flat panel display 10 comprises a baseplate 12 and a faceplate 14. Baseplate 12 includes substrate 16, which is preferably formed from an insulative glass material. Column interconnects 18 are formed and patterned over substrate 16. The purpose and function of column interconnects 18 is disclosed in greater detail below. Furthermore, a resistor layer 20 may be disposed over column interconnects 18. Electron emission tips 22 are formed over substrate 16 at the sites from which electrons are to be emitted, and may be constructed in an etching process from a layer of amorphous silicon that has been deposited over substrate 16. Electron emission tips 22 are protrusions that may have one or many shapes, such as pyramids, cones, or other geometries that terminate at a fine point for the emission of electrons.

An extraction grid 24, or gate, which is a conductive structure that supports a positive charge relative to the electron emission tips 22 during use, is separated from substrate 16 with a dielectric layer 26. Extraction grid 24 includes openings 28 through which electron emission tips 22 are exposed. Dielectric layer 26 electrically insulates extraction grid 24 from electron emission tips 22 and the associated column interconnects which electrically connect the emission tips with a voltage source 30.

Faceplate 14 includes a plurality of pixels 32, which comprise cathodoluminescent material that generates visible light upon being excited by electrons emitted from electron emission tips 22. For example, pixels 32 may be red/green/blue full-color triad pixels. Faceplate 14 further includes a substantially transparent anode 34 and a glass or another transparent panel 36. Spatial support structures or spacers 38 are disposed between baseplate 12 and faceplate 14 and prevent the faceplate from collapsing onto the baseplate due to air pressure differentials between the opposite sides of the faceplate. In particular, the gap between faceplate 14 and baseplate 12 is typically evacuated, while the opposite side of the faceplate generally experiences ambient atmospheric pressure.

The flat panel display is operated by generating a voltage differential between electron emission tips 22 and grid structure 24 using voltage source 30. In particular, a negative charge is applied to electron emission tips 22, while a positive charge is applied to grid structure 24. The voltage differential activates electron emission tips 22, whereby a flux of electrons 40 is emitted therefrom. In addition, a relatively large positive charge is applied to anode 34 using voltage source 30, with the result that a flux of electrons 40 strikes the faceplate. The cathodoluminescent material of pixels 32 is excited by the impinging electrons, thereby generating visible light. The coordinated activation of multiple electron emission tips over the flat panel display 10 may be used to produce a visual image on faceplate 14.

Figure 2:
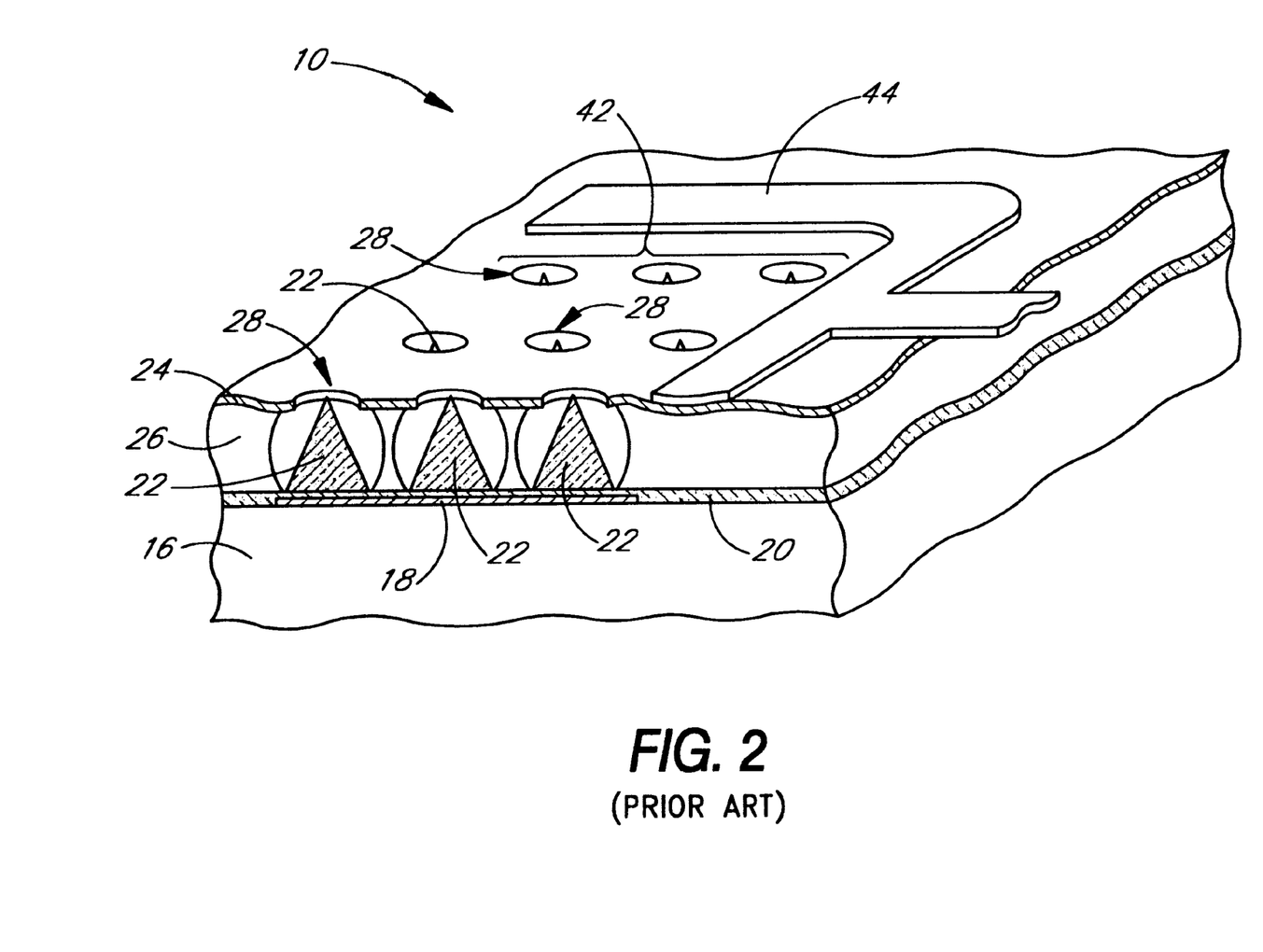
FIG. 2 is an isometric view of a baseplate of a flat panel display, showing an emitter set comprising a plurality of electron emission tips.
Figure 3:
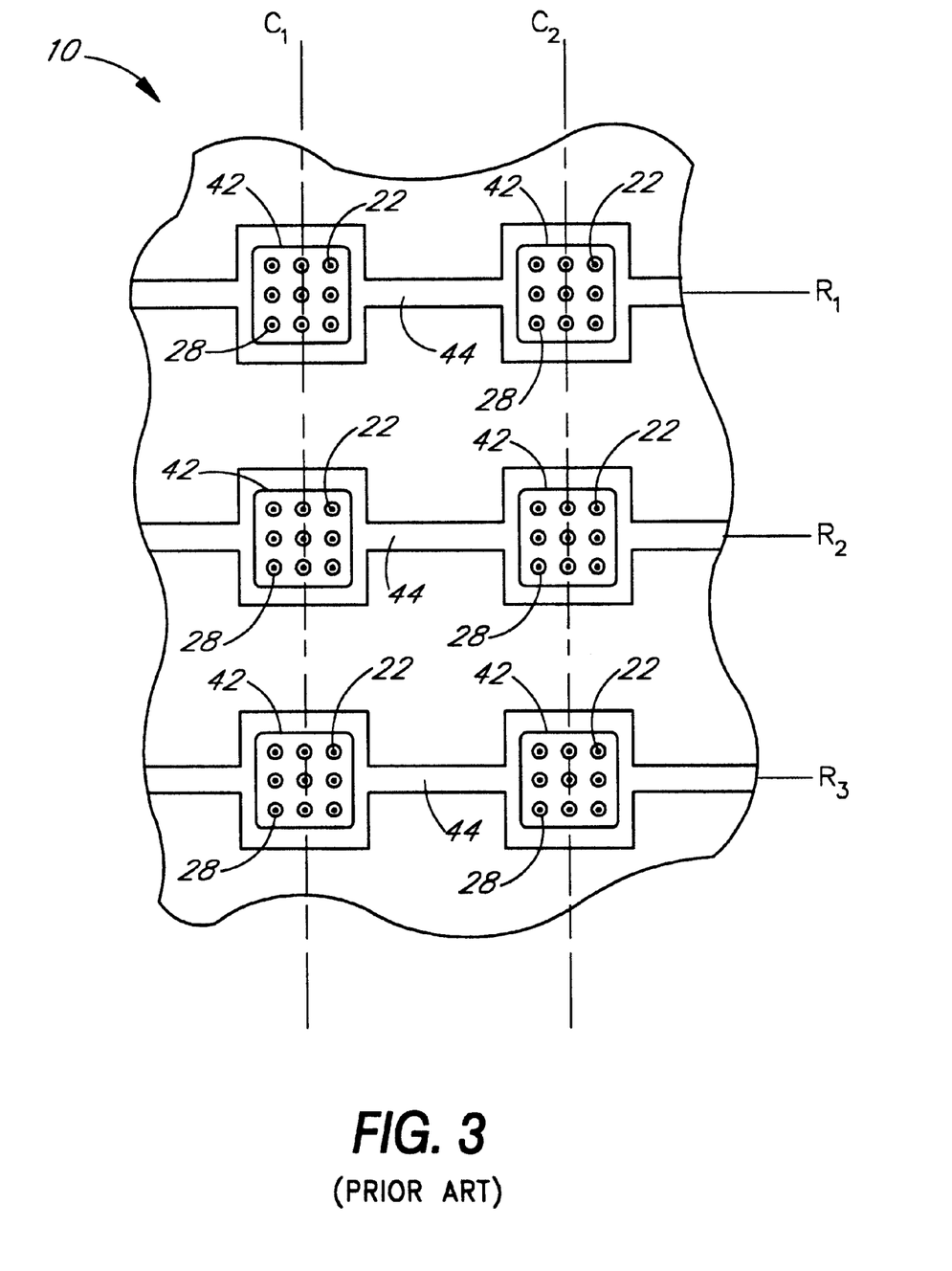
FIG. 3 is a top view of the baseplate of flat panel display of FIG. 2, showing the addressable rows and columns.

FIGS. 2 and 3 further illustrate conventional field emission devices. In particular, electron emission tips 22 are grouped into discrete emitter sets 42, in which the bases of the electron emission tips in each set are commonly connected. As shown in FIG. 3, for example, emitter sets 42 are configured into columns (e.g., $C_1$–$C_2$) in which the individual emitter sets 42 in each column are commonly connected. Additionally, the extraction grid 24 is divided into grid structures, with each emitter set 42 being associated with an adjacent grid structure. In particular, a grid structure is a portion of extraction grid 24 that lies over a corresponding emitter set 42 and has openings 28 formed therethrough. The grid structures are arranged in rows (e.g., $R_1$–$R_3$) in which the individual grid structures are commonly connected in each row. Such an arrangement allows an X–Y addressable array of grid-controlled emitter sets. The two terminals, comprising the electron emission tips 22 and the grid structures, of the three terminal cold cathode emitter structure (where the third terminal is anode 34 in faceplate 14 of FIG. 1) are commonly connected along such columns and rows, respectively, by means of high-speed interconnects. hi particular, column interconnects 18 are formed over substrate 16, and row interconnects 44 are formed over the grid structures.

In operation, a specific emitter set is selectively activated by producing a voltage differential between the specific emission set and the associated grid structure. The voltage differential may be selectively established through corresponding drive circuitry that generates row and column signals that intersect at the location of the specific emitter set. Referring to FIG. 3, for example, a row signal along row $R_2$ of the extraction grid 24 and a column signal along column $C_1$ of emitter sets 42 activates the emitter set at the intersection of row $R_2$ and column $C_1$. The voltage differential between the grid structure and the associated emitter set produces a localized electric field that causes emission of electrons from the selected emitter set.

Further details regarding FED devices are disclosed in assignee's copending application entitled FIELD EMISSION DEVICE WITH BUFFER LAYER AND METHOD OF MAKING, application Ser. No. 09/096,085, filed Jun. 11, 1998, now U.S. Pat. No. 6,211,608, and U.S. Pat. No. 5,372,973, both of which are hereby incorporated by reference in their entirety.

Figure 4:
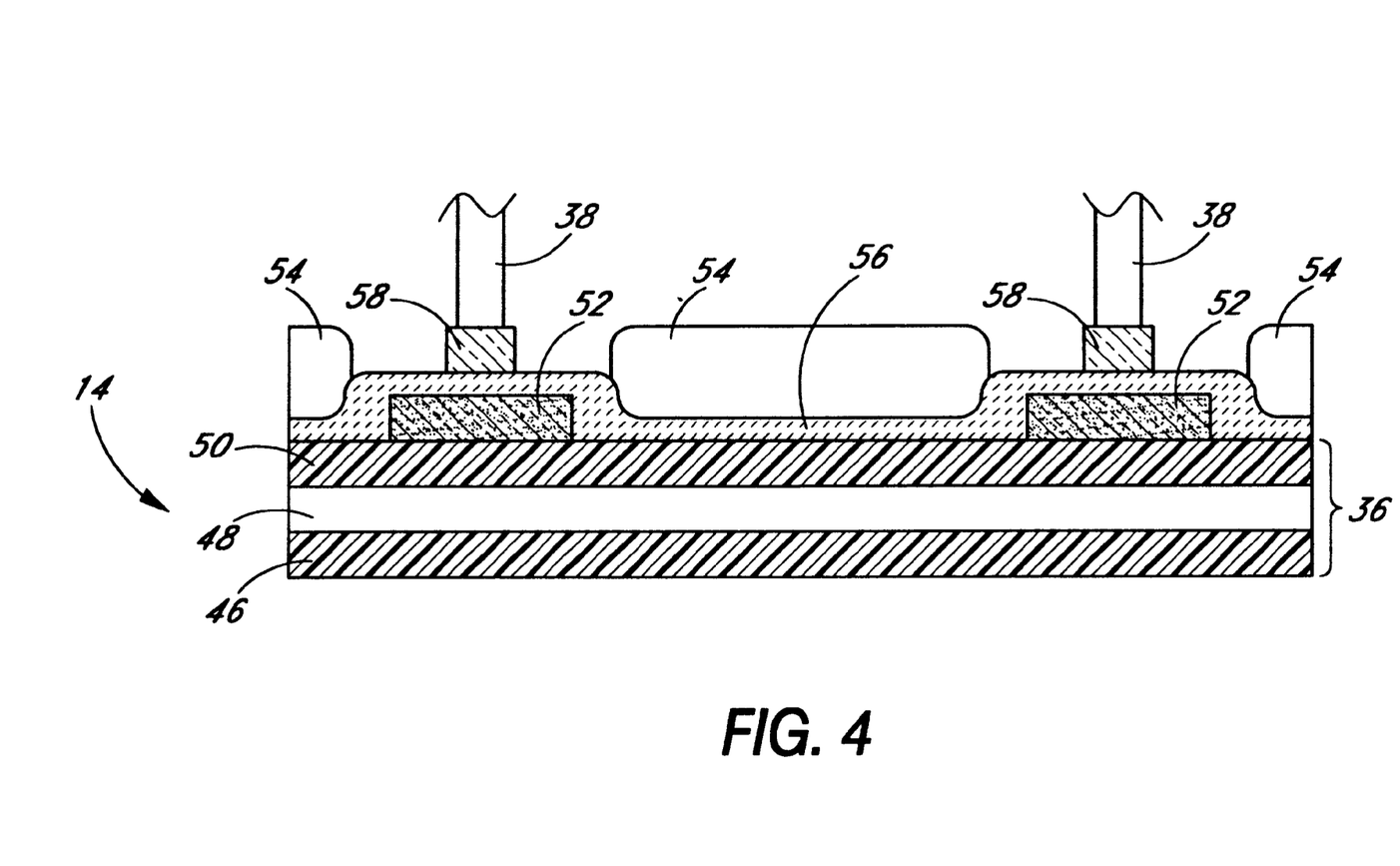
FIG. 4 is a schematic cross-sectional view of an FED faceplate bonded to a plurality of spacers.

FIG. 4 illustrates more particularly a portion of a faceplate of an FED device fabricated according to a preferred embodiment of the present invention. The faceplate 14, shown upside-down relative to the faceplate of FIG. 1, includes a substrate 36 comprising a glass substrate 48, a first $SiN_x$ layer 46 formed on one side of the glass substrate 48, and a second $SiN_x$ layer 50 formed on the other side of the glass substrate 48. The first $SiN_x$ layer 46 represents the viewing side of the faceplate 14, and is preferably about 500 to 2000 Å thick. The glass layer 48 is preferably soda lime glass or borosilicate glass, and preferably has a thickness between about 0.5 and 5 mm. The second $SiN_x$ layer 50 is an antireflective layer preferably about 500 to 2000 Å thick. In one embodiment, both the first and second $SiN_x$ layers are more preferably $Si_3N_4$.

A black matrix grill 52 is preferably formed over the $SiN_x$ layer 50. This grill 52 is preferably made of sputtered amorphous Si, and defines open regions for phosphor layer 54. The grill 52 preferably has a thickness of between 3000 and 20,000 Å, with the openings in the grill preferably created by using an etchant such as an $HNO_3$, HF, acetic acid mixture to etch the amorphous silicon, or KOH/PA mixtures.

The transparent anode 34 of FIG. 1 is preferably a layer of indium tin oxide 56 as shown in FIG. 4. The ITO layer 56 is preferably formed over the black matrix Si layer 52 and over the $SiN_x$ layer 50. The ITO layer 56 is preferably deposited using physical vapor deposition, for example DC sputtering, and has a thickness preferably between about 2000 and 5000 Å. The applied voltage across the ITO layer is preferably about 1000 to 3000 DC volts.

Figure 5:
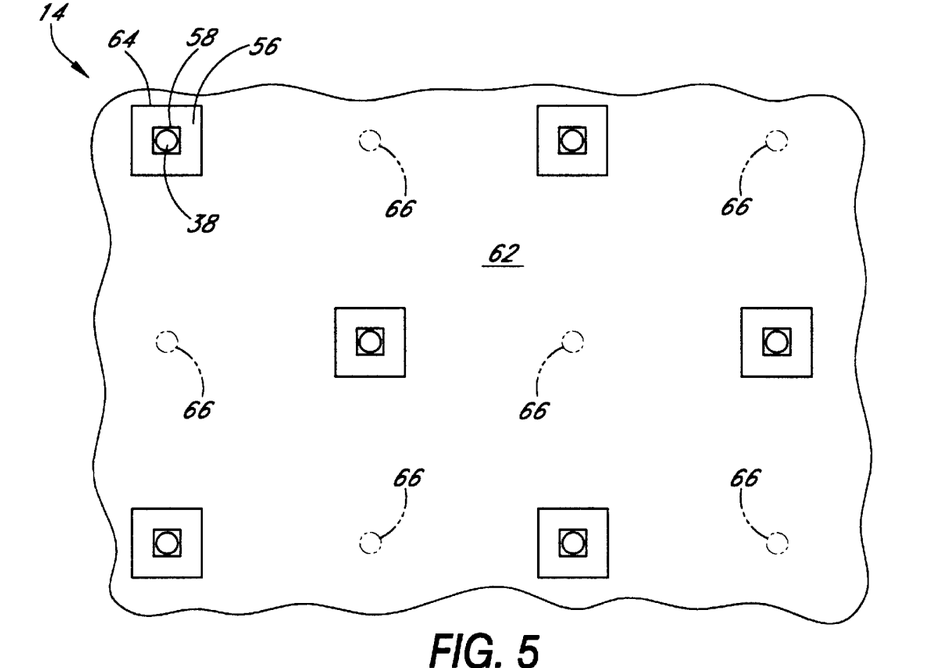
FIG. 5 is a schematic top view of the faceplate of FIG. 4, showing an aluminum layer deposited thereon.

Bonding pads 58 are preferably distributed around the faceplate 14, as shown in FIG. 4 and in a top view illustrated in FIG. 5 (with aluminum layer 62 also shown, as described below). These bonding pads 58 are located over the black matrix grill 52 and the ITO layer 56 and provide the location for bonding the spacers 38 to the faceplate 14. The bond pads 58 are preferably made of silicon, and preferably have a surface area when viewed from above of about 35×35 µm. As shown in FIG. 5, the bonding pads 58 are preferably alternatingly staggered across the faceplate so that the spacers 38 bonded thereon are also spaced in a staggered configuration. It will be appreciated that bond pads 58 may be located in various other configurations on the faceplate 14.

As shown in FIGS. 4 and 5, glass spacers 38 are bonded to the faceplate 14 at bond pads 58 to form the spacers between the faceplate 14 and baseplate 12 (not shown). These spacers 38 are more preferably made of a soda lime silicate glass or borosilicate glass. Glasses containing oxides of Sl, Pb, Na, K, Ba, Al, and Ag may also be used. Bonding of the spacers to the faceplate is preferably accomplished using anodic bonding, although other types of bonding such as adhesive bonding may also be used.

Figure 6:
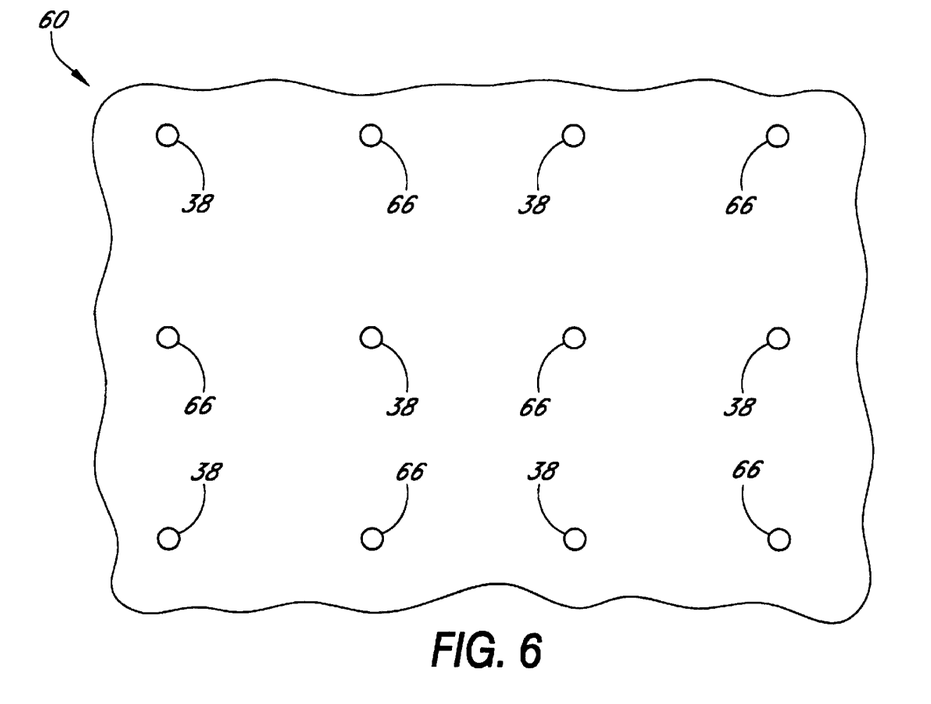
FIG. 6 is a schematic top view of an array of spacers to be bonded to the faceplate of FIG. 5.
Figure 7A:
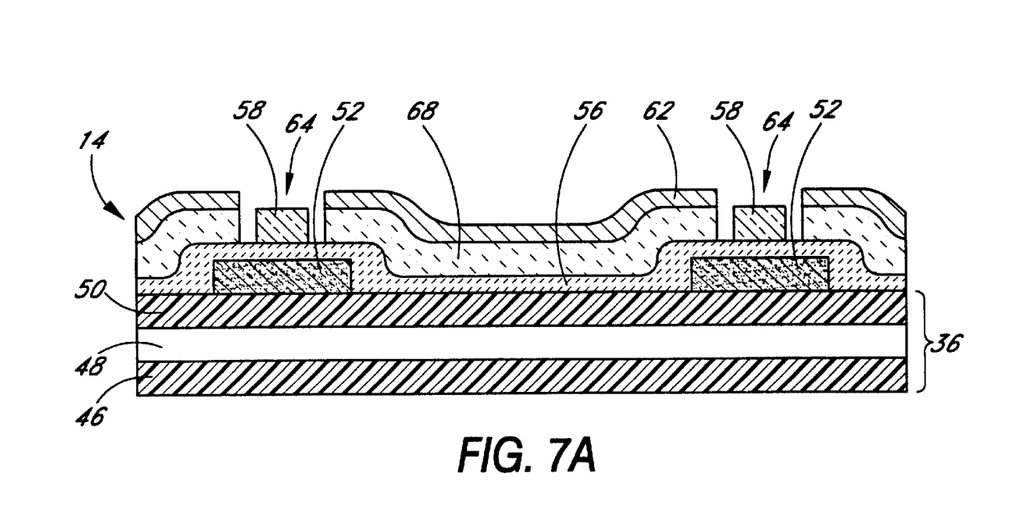
FIG. 7A is a schematic cross-sectional view of a flat panel display faceplate having an aluminum layer and an aluminum oxide layer formed thereover.
Figure 7B:
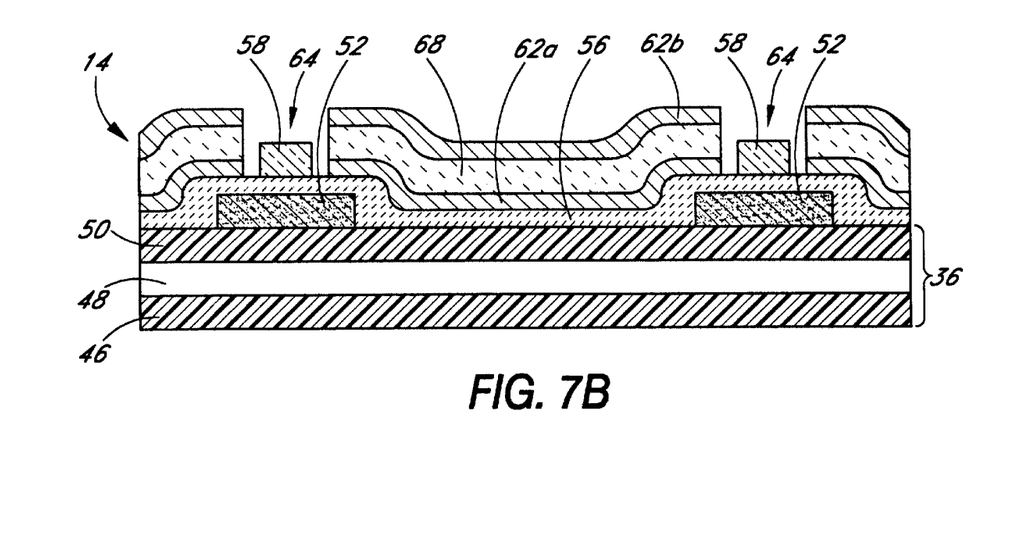
FIG. 7B is a schematic cross-sectional view of a flat panel display faceplate having an aluminum oxide layer formed thereover and sandwiched between two aluminum layers.

Although the bond pads are preferably alternatingly staggered around the faceplate 14 as shown in FIG. 5, it is preferred in one embodiment to attach spacers to the faceplate 14 using a uniform array 60 of spacers, such as shown in FIG. 6, which contains more spacers than there are bond pads 58. Thus, the array 60 not only contains the spacers 38 which are to be anodically bonded to the bond pads 58, but it also contains misaligned spacers 66 which will not be bonded to the bond pads 58. The misaligned spacers are instead anodically bonded to a sacrificial aluminum layer 62 formed over the faceplate 14, as illustrated in FIGS. 7A and 7B and described in further detail below. A matrix glass material is used to keep the spacers in the proper pattern until after they are selectively removed after anodic bonding. In one embodiment, after bonding the matrix glass is removed by etching preferably using an $HNO_3/H_2O$ or $HCl//HNO_3/H_2O$ or $HCl/H_2O$ mixture. Then, the bulk of the aluminum is removed preferably using $HNO_3/H_3PO_4$/acetic acid mixture. KOH or NaOH is then preferably used to remove the misaligned spacers 66. The advantages of the uniform array 60 include its simplicity of design as well as lower cost. Furthermore, because anodic bonding occurs at temperatures, for example, of about 450° C., a uniform array of spacers is desired to create a more uniform stress distribution when the structure is subsequently cooled.

As shown in FIGS. 5, 7A and 7B, the aluminum layer 62 has wells 64 to permit access for the aligned spacers 38 to the bonding pads 58. Then, when the array 60 of spacers 38 is brought to the faceplate 14 for anodic bonding, spacers 38 are bonded to the bond pads 58 within the wells 64, while the misaligned spacers 66 are bonded to the aluminum layer 62, as shown in phantom in FIG. 5. During subsequent processing of the faceplate, this aluminum layer 62 is removed, along with the misaligned spacers 66 to leave the desired spacer arrangement.

FIG. 7A illustrates generally the structure of the desired aluminum layer over the faceplate 14 for use in the anodic bonding procedure described above. A barrier layer 68, preferably formed of aluminum oxide and described in further detail below, is first formed over the ITO layer 56. Other processes may use barrier layers of $SiN_x$ (nitride) or $SiO_2$ (oxide) between the aluminum and the ITO. However, removal of these layers requires either dry etching techniques which pose throughput limitations (especially for large area devices) as well as ion damage to the ITO or wet etching techniques which also damage the ITO film. For example, etching of nitrides requires temperatures greater than 150° C. and highly concentrated phosphoric acid, which damages and etches ITO. Oxide generally requires HF based wet etchants which also damage and etch ITO. Furthermore, a $SiN_x$ film itself has pinholes allowing diffusion, thereby causing corrosion when exposed to certain wet chemistries during lithography and etch.

An aluminum layer 62 is formed over the barrier layer 68, which extends above the ITO layer 56 approximately the same height as that of the bond pads 58. FIG. 7B illustrates another embodiment in which two aluminum layers 62a and 62b sandwich the aluminum oxide layer 68.

In both FIGS. 7A and 7B, wells 64 are preferably formed through the aluminum layer 62 (62a and 62b in FIG. 7B) and barrier layer 68 down to the ITO layer 56. These wells 64 are staggered in the desired configuration according to where the bonding pads 58 and spacers 38 are to be located, as shown in FIG. 5. In one embodiment, the wells preferably have a bottom surface area of about 45×45 μm. After anodic bonding is complete, the barrier layer 68 and aluminum layer 62 or layers 62a and 62b are removed, giving the faceplate 14 the structure shown in FIG. 4.

Figure 8:
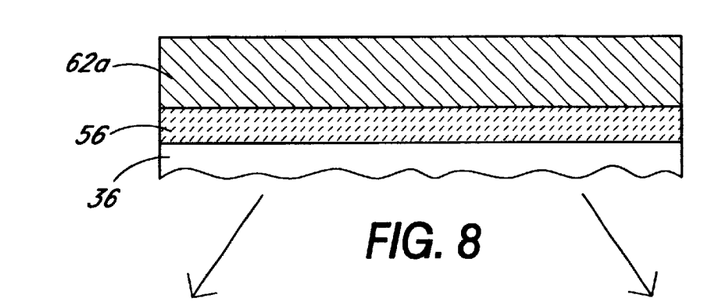
FIG. 8 is a schematic cross-sectional view of a structure having an ITO layer for a flat panel display faceplate and the like according to a first preferred embodiment, with an aluminum layer formed thereover.

FIG. 8–15 illustrate more particularly the formation the aluminum oxide barrier layer 68 illustrated in FIGS. 7A and 7B. FIG. 8 illustrates schematically a portion of the faceplate 14 wherein the ITO layer 56 is formed over a substrate 36. This substrate 36 may include the $SiN_x$ layers 46 and 50 and glass layer 48 described above, the black matrix layer 52, or any other substrate as would be known to one of skill in the art. The ITO layer 56 is preferably deposited over the substrate 36, and an aluminum layer 62a is formed over the ITO layer 56.

The aluminum layer 62a illustrated in FIG. 8 is preferably deposited using DC sputtering as a pressure of about 1–10 mTorr at a power of about 2,000 to 10,000 watts. Pure Ar gas is used at a carrier, flowing at a rate of about 10 to 800 sccm. The substrate temperature is preferably between about 100 and 400° C. It will be appreciated that the aluminum layer 62 can be formed by a variety of methods, including RF sputtering, DC sputtering, ion beam sputtering, these and other methods being known to one of ordinary skill in the art.

Figure 9:
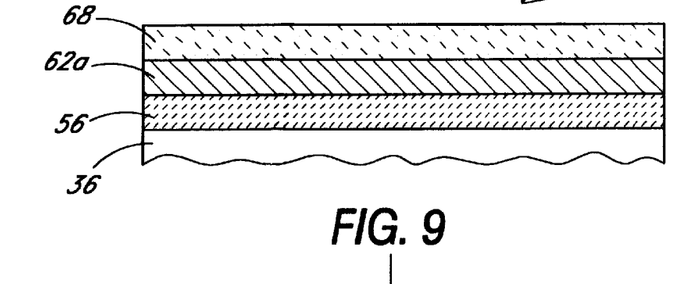
FIG. 9 is a schematic cross-sectional view of the structure of FIG. 8, showing partial anodization of the aluminum layer.
Figure 10:
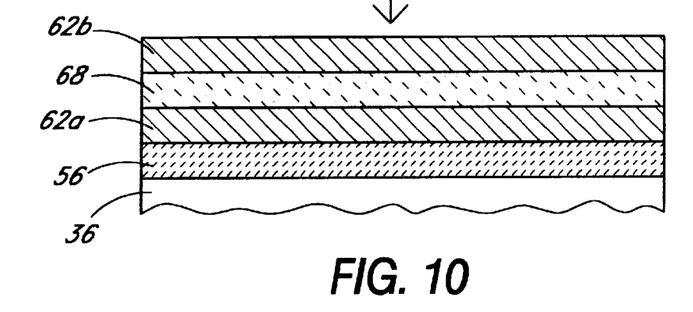
FIG. 10 is a schematic cross-sectional view of the structure of FIG. 9, showing the deposition of an additional layer of aluminum.

FIG. 9 illustrates the formation of an aluminum oxide barrier layer 68 over the ITO layer 56. In one embodiment, the aluminum layer 62a is partially anodized to form an $Al_2O_3$ layer 68. Anodization preferably occurs by a process such as electrolytic anodization, a wet oxidizing agent such as $H_2O_2$, or an oxygen plasma. In one preferred embodiment, electrolytic anodization is used for a non in situ process, examples of which are given in Ching-Fa Yeh et al., in. Japan J. Appl. Phys. vol. 32 (1993) pp. 2803–2808, part 1, no. 6A, Jun. 1993. This process leaves the intermediate aluminum layer 62a and the $Al_2O_3$ layer 68 thereover. Then, as shown in FIG. 10, an additional aluminum layer 62b is deposited over the $Al_2O_3$ layer 68, thereby generally forming the layered structure shown in FIG. 7B. This layered structure protects the ITO layer 56 from damage due to ion diffusion through the aluminum. The structure also allows for a good electrical contact between Al and ITO. The sandwiched buffer layer 68 of $Al_2O_3$ further suppresses topside hillocks in the top aluminum layer 62b, because the presence of the barrier layer 68 minimizes the aluminum grain size in the layer 62b.

Figure 11:
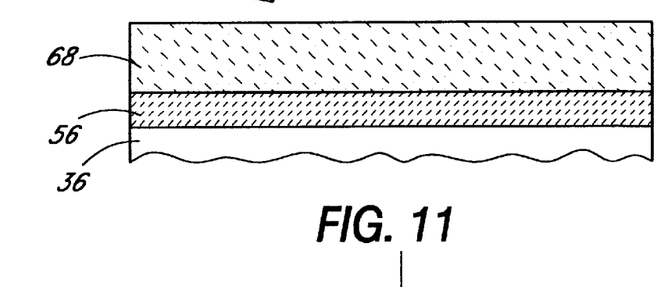
FIG. 11 is a schematic cross-sectional view of the structure of FIG. 8, showing complete anodization of the aluminum layer.
Figure 12:
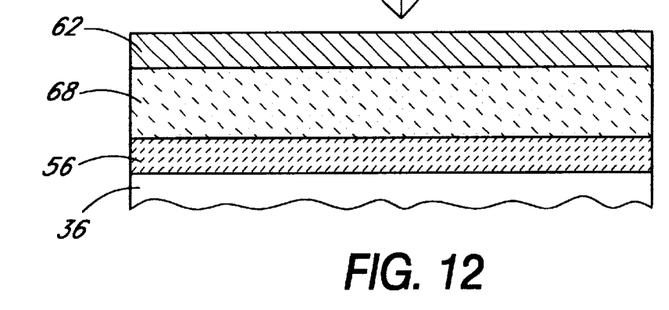
FIG. 12 is a schematic cross-sectional view of the structure of FIG. 11, showing the deposition of an additional layer of aluminum.

FIG. 11 illustrates another preferred embodiment for forming an aluminum oxide barrier layer. The aluminum layer 62a of FIG. 8 is preferably completely anodized, as shown in FIG. 11 to form an $Al_2O_3$ layer 68. An aluminum layer 62 is formed over the $Al_2O_3$ layer 68 as shown in FIG. 12, preferably using a sputtering technique as described above. The resulting structure as shown in FIG. 12 may be used to form the structure shown in FIG. 7A. The barrier layer 68 in this structure protects the ITO layer 56 from damage due to ion diffusion and suppresses hillock formation. In this structure, the aluminum layer 62 and the ITO layer 56 are electrically isolated.

Figure 13:
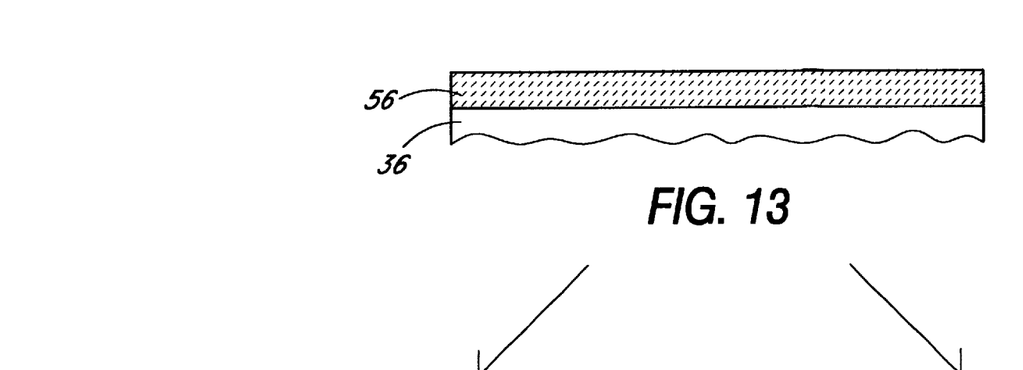
FIG. 13 is a schematic cross-sectional view of a structure having an ITO layer formed according to a second preferred embodiment of the present invention, showing the formation of the ITO layer on a substrate.
Figure 14:
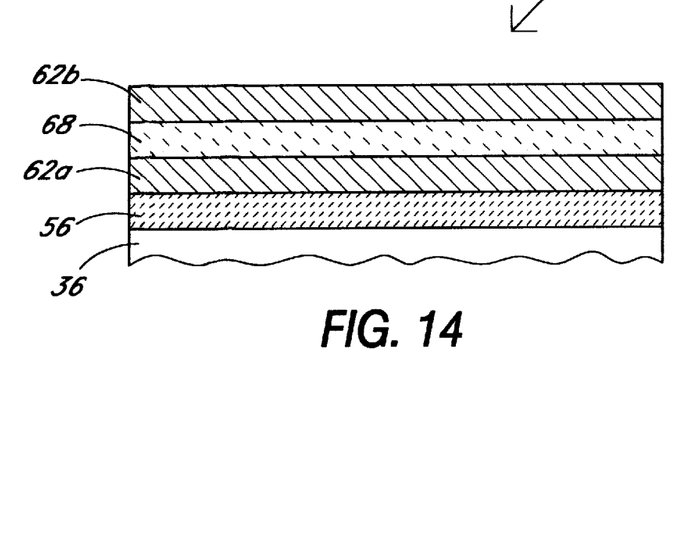
FIG. 14 is a schematic cross-sectional view of the display structure of FIG. 13, showing the deposition of an intermediate aluminum layer, an aluminum oxide layer and a top aluminum layer thereover.
Figure 15:
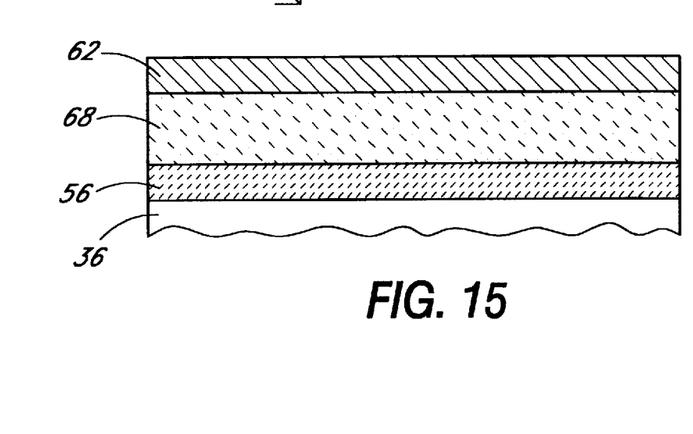
FIG. 15 is a schematic cross-sectional view of the display structure of FIG. 13, showing the deposition of an aluminum oxide layer and an aluminum layer thereover.

FIGS. 13–15 illustrate another embodiment using in situ methods for protecting an ITO layer 56 from damage due to exposure to an aluminum layer. As shown in FIG. 13, an ITO layer 56 is formed directly over a substrate 36. In one embodiment, as shown in FIG. 14, an aluminum layer 62a is deposited over the ITO layer 56, preferably in situ by a physical vapor deposition (PVD) process as described above or chemical vapor deposition (CVD). Then, an $Al_2O_3$ layer 68 is deposited over the aluminum layer 62a. In one embodiment, the $Al_2O_3$ layer 68 is deposited by reactive sputtering (PVD) with an aluminum target and $O_2$/Ar gases. In this embodiment, deposition occurs by RF magnetron sputtering at a pressure of about 1–15 mTorr at a power of 1,000 to 6,500 watts. A mixture of Ar (94%) and $O_2$ (6%) flows into the chamber at a rate of about 10–800 sccm. The substrate temperature is preferably about 100 to 400° C. In another embodiment, sputtering may occur with an $Al_2O_3$ target and an $Ar/O_2$ ratio of about 1. Chemical vapor deposition (CVD) or metal organic vapor phase deposition (MOVPD) with gases such as trimethylaluminum and hydrogen peroxide may also be used.

Then, an aluminum layer 62b is deposited over the $Al_2O_3$ layer, preferably using a method such as described above. More particularly, when using a sputtering technique to form the $Al_2O_3$ layer 68, the aluminum layer may be formed simply by turning off the $O_2$ gas flow. The structure illustrated in FIG. 14 corresponds substantially to the structure illustrated in FIG. 10, as well as in FIG. 7B.

As shown in FIG. 15, the $Al_2O_3$ layer 68 can be grown directly over the ITO layer 56, followed by growth of an aluminum layer 62 using the in situ methods described above. The structure shown in FIG. 15 corresponds to the structure formed by complete anodization shown in FIG. 12, as well as the structure shown in FIG. 7A.

The aluminum oxide barrier layers 68 illustrated in FIGS. 10, 12, 14 and 15 should be thick enough to prevent a conductive path between the top aluminum layer 62 or 62b and the ITO layer 56. The layer 68 preferably has a thickness ranging from about 100 to 10,000 Å, more preferably about 300 to 5,000 Å, and even more preferably about 500 to 1,500 Å. The desired thickness of the layer 68 also depends on the surface topography of the underlying layers, which in one embodiment, may have a roughness of about 500 Å. Roughness of this magnitude would necessitate an aluminum oxide thickness greater than 500 Å.

The thickness of the top aluminum layer 62b in FIGS. 10 and 14, and the aluminum layer 62 in FIGS. 12 and 15, is preferably between about 4,000 and 10,000 Å. In an embodiment where the aluminum layer 62 or 62b is used for anodic bonding to spacers, the thickness of this layer should be great enough to allow anodic bonding. For the display device structures shown in FIGS. 7A and 7B, the total thickness of the aluminum oxide and aluminum layers should be approximately equal to the thickness of the bond pads 58.

Although the preferred embodiments above have been described as using a barrier layer of $Al_2O_3$, the aluminum oxide barrier layer 68 may generally be represented as $AlO_x$, where x is between about 0.25 and 1.5. It will be appreciated that both the aluminum and aluminum oxide layers may be formed by a variety of methods as would be known to one skilled in the art. Furthermore, when sputtering is used, the choice of target may varied, using for example, Al, $Al_2O_3$, Al-Si alloy, and Al doped with rare earth elements. The mixing ratio of Ar and $O_2$ gas may also be varied.

The aluminum oxide layer illustrated and described in the embodiments above acts as a protective barrier preventing surface and bulk property damage of the ITO, or other films including other tin oxides, during downstream thermal processes such as anodic bonding and thermal diffusion processing. In particular, the aluminum oxide barrier provides protection to the ITO layer by preventing diffusion of atoms and ions into the ITO during thermal cycling, thermal diffusion processes, low energy ion implantation processes, and processes which involve electric and/or magnetic fields. For example, the $Al_2O_3$ layer 68 described above protects the ITO layer 56 from optical and electrical defects sustained during anodic bonding of structures onto the aluminum located on the film side of the ITO. These processes typically operate at 500 V at 450° C. If no barrier is used between the aluminum and ITO, patterned defects in the ITO arise from ionic diffusion from the structures through the aluminum during anodic bonding of structures to the substrate, thus causing damage to the ITO.

Another advantage of using aluminum oxide as a barrier layer, especially in comparison to $SiN_x$ and $SiO_2$, is that aluminum oxide allows for greater throughput because it permits the use of wet processing of large area devices or panels. For example, during removal of the aluminum layer 62 or layers 62a and 62b in FIGS. 7A and 7B, respectively, to form the structure of FIG. 4, if a barrier layer of $SiN_x$ is used between the aluminum and the ITO, dry etching is required because the conventional etchant, $H_3PO_4$, causes damage to ITO at temperatures greater than about 150° C. Aluminum oxide, by contrast, can be etched at lower temperatures, thereby preventing damage to the ITO and enabling faster processing times. For instance, the aluminum oxide can be selectively etched over ITO using chemicals such as moderately concentrated phosphoric acid or phosphoric acid/nitric acid/acetic acid combinations at moderate temperatures, up to about 60° C. These etchants at these lower temperatures do not cause significant damage to the ITO.

Further advantages of the barrier layer described above include that the aluminum oxide and aluminum layers can be deposited in situ and etched in one wet process step. Moreover, an aluminum oxide barrier prevents aluminum hillocks from pinning into the ITO film as well as the associated surface deformations of the ITO which are caused by hillocks. The $Al_2O_3$ barrier also provides a good adhesion layer for aluminum to the substrate and reduces film stress. All of the factors above increase the yield of the fabricated devices.

The embodiments illustrated and described above are provided merely as examples of certain preferred embodiments of the present invention. Other changes and modifications can be made from the embodiments presented herein by those skilled in the art without departure from the spirit and scope of the invention, as defined by the appended claims.

What is claimed is:

1. A method of fabricating a display device structure, comprising:

forming a tin oxide layer;

forming an aluminum oxide layer over the tin oxide layer; and forming an aluminum layer over the aluminum oxide layer after the aluminum oxide layer has been formed over the tin oxide layer, the aluminum layer directly covering a substantial portion of the aluminum oxide layer.

2. The method of claim 1, wherein the tin oxide layer is indium tin oxide.

3. The method of claim 1, wherein the aluminum oxide layer is formed by anodizing aluminum.

4. The method of claim 3, wherein the aluminum is anodized by a process selected from the group consisting of using electrolytic anodization, a wet oxidizing agent and an oxygen plasma.

5. The method of claim 3, wherein the aluminum is partially anodized to form a sandwiched aluminum layer between the tin oxide layer and the aluminum oxide layer formed by anodization.

6. The method of claim 3, wherein the aluminum is completely anodized.

7. The method of claim 1, further comprising depositing an intermediate aluminum layer over the tin oxide layer prior to forming the aluminum oxide layer.

8. The method of claim 7, wherein the intermediate aluminum layer is formed by sputtering.

9. The method of claim 1, wherein the aluminum oxide layer is formed by reactive sputtering.

10. The method of claim 1, wherein the aluminum layer is formed by sputtering.

11. The method of claim 1, wherein the aluminum oxide later comprises $AlO_x$ where x is between about 0.25 and 1.5.

12. The method of claim 1, wherein the aluminum layer and aluminum oxide layer cover the tin oxide layer except for regions where there are wells formed in the tin oxide layer.

* * * * *

UNITED STATES PATENT AND TRADEMARK OFFICE
CERTIFICATE OF CORRECTION

PATENT NO.   : 6,471,879 B2                                                                   Page 1 of 1
DATED        : October 29, 2002
INVENTOR(S)  : Robert J. Hanson, Won-Joo Kim and Mike E. Pugh It is certified that error appears in the above-identified patent and that said Letters Patent is hereby corrected as shown below:

<u>Column 5,</u>
Line 25, "hi" should be -- in --

Signed and Sealed this

Thirteenth Day of January, 2004

JON W. DUDAS
*Acting Director of the United States Patent and Trademark Office*